(12) United States Patent
Forster

(10) Patent No.: US 6,480,062 B1
(45) Date of Patent: Nov. 12, 2002

(54) REFLECTION AMPLIFIER CIRCUIT

(75) Inventor: Ian J Forster, Chelmsford (GB)

(73) Assignee: Marconi Data Systems Limited, Hatfield (GB)

( * ) Notice: Subject to any disclaimer, the term of this patent is extended or adjusted under 35 U.S.C. 154(b) by 0 days.

(21) Appl. No.: 09/926,573

(22) PCT Filed: May 17, 2000

(86) PCT No.: PCT/GB00/01893

§ 371 (c)(1),
(2), (4) Date: Mar. 12, 2002

(87) PCT Pub. No.: WO00/72439

PCT Pub. Date: Nov. 30, 2000

(30) Foreign Application Priority Data

May 22, 1999 (GB) ................................. 991188

(51) Int. Cl.[7] ................................. H03F 1/14
(52) U.S. Cl. .................. 330/51; 330/150; 330/306; 330/310
(58) Field of Search .................. 330/51, 150, 306, 330/310; 333/1.1

(56) References Cited

U.S. PATENT DOCUMENTS 3,768,029 A * 10/1973 Upadhyayula et al. ......... 330/5
3,930,206 A * 12/1975 Rosen et al. .................. 330/53
4,086,543 A 4/1978 Nigrin ......................... 330/287
5,530,402 A 6/1996 Wright ......................... 330/51

FOREIGN PATENT DOCUMENTS

| DE | 2459053 | * 6/1976 |
| JP | 55137707 | 10/1980 |
| JP | 60127806 | 7/1985 |

OTHER PUBLICATIONS

Shen et al. Active Radiating Oscillator using a reflection Amplifier Module Electronics Letters, vol. 28 issue II, May 21, 1992 pp 991–992.*

* cited by examiner

Primary Examiner—Michael B Shingleton
(74) Attorney, Agent, or Firm—Kirschstein, et al.

(57) ABSTRACT

An amplifier circuit for amplifying an input signal to generate an amplifier output signal incorporates a cascaded series of reflection amplifiers arranged along a signal path and operative to amplify signals propagating in a forward direction along the signal path. The circuit is operative to counteract signal propagation in a reverse direction along the signal path, thereby hindering spontaneous oscillation from arising within the circuit. Incorporation of reflection amplifiers into the circuit enables it to provide high gain, for example 50 dB, while consuming low currents, for example, tens of microamperes. The circuit is especially suitable for use at intermediate frequencies in radio receivers such as mobile telephones.

10 Claims, 2 Drawing Sheets

REFLECTION AMPLIFIER CIRCUIT

Figure 1:
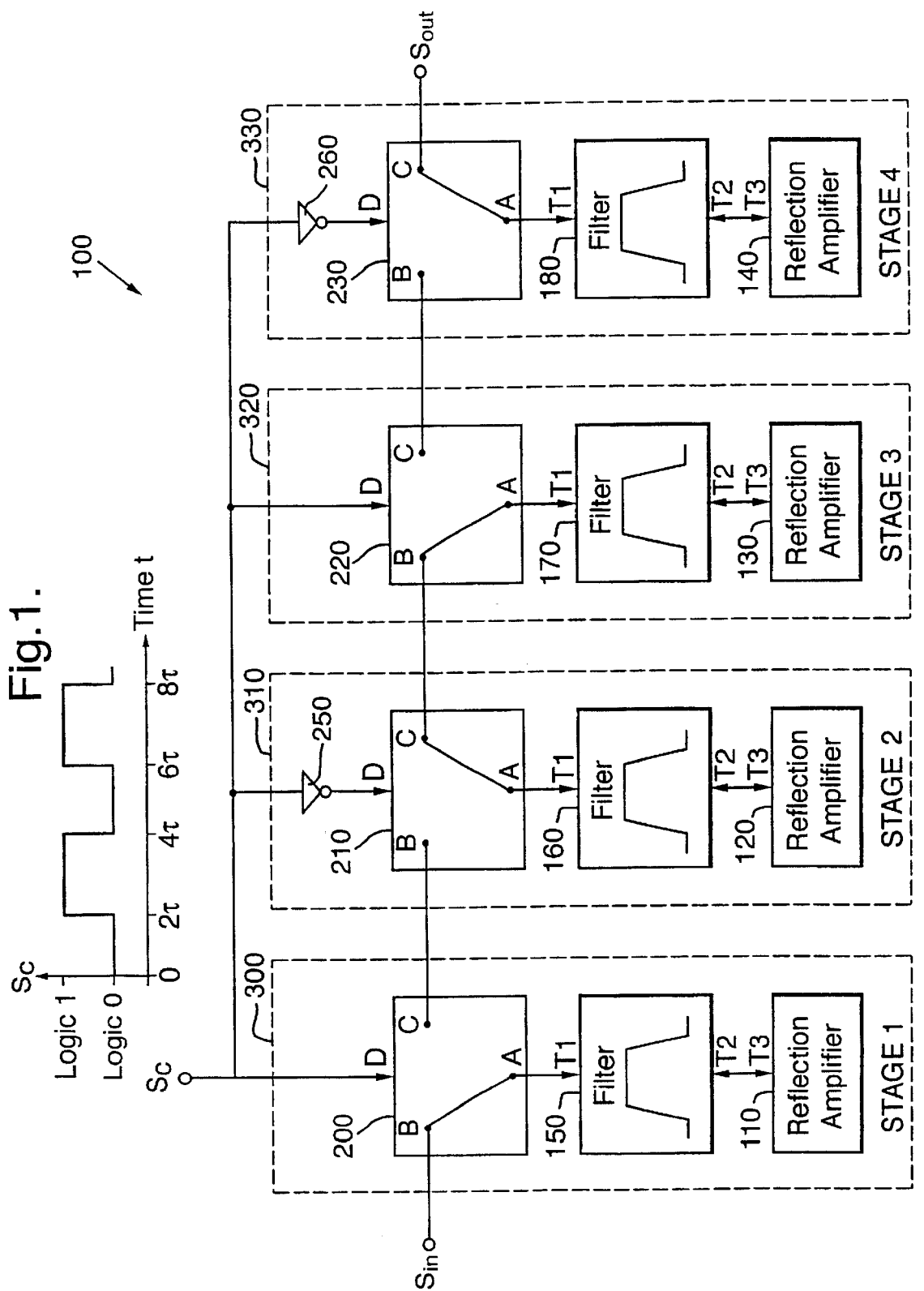

This invention relates to an amplifier circuit, in particular but not exclusively to an amplifier circuit for providing bandpass amplification at intermediate frequencies in radio receivers.

Amplifiers are widely used in the prior art for amplifying input signals applied thereto to provide amplified output signals. This is particularly important in radio receivers in which radiation received thereat generates corresponding antenna received signals which typically have an amplitude of microvolts. The radio receivers employ amplifiers therein to amplify such received signals to an amplitude in the order of millivolts to volts, for example to drive a loudspeaker. Since it is difficult to prevent amplifiers designed to amplify at radio frequencies from spontaneously oscillating, especially if they comprise cascaded gain providing stages, it is customary to heterodyne the received signals to lower intermediate frequencies whereat it is easier to provide a high degree of amplification and also provide more selective bandpass signal filtration.

In prior art radio receivers, it is therefore customary to provide a majority of signal amplification required at intermediate frequencies, namely frequencies lying intermediate between that of the radiation received and audio or video frequencies. For example, a radio receiver receives radiation at a frequency of 500 MHz and generates a corresponding antenna received signal also at 500 MHz. The receiver heterodynes the received signal to generate an intermediate frequency signal in a frequency range around 10.7 MHz which is then amplified and filtered, and finally demodulates the amplified intermediate frequency signal to generate a corresponding audio output signal having signal components in a frequency range of 100 Hz to 5 kHz.

Recently, because the radio frequency spectrum is becoming increasingly congested, there is a trend to use an ultra high frequency (UHF) range in contemporary communications systems, namely around 500 MHz; transmission at microwave frequencies, for example 1 GHz to 30 GHz is now also employed. Associated with this is a trend in modern radio receiver design to employ intermediate frequency amplification at several tens of MHz or greater; this is done in order to obtain adequate ghost image rejection associated with using heterodyne processes.

In modem mobile telephones, most signal amplification is provided in intermediate frequency amplifier circuits incorporated therein. These circuits comprise transmission amplifiers and associated surface acoustic wave (SAW) or ceramic filters to provide a narrow bandpass signal amplification characteristic; the circuits and their associated filters are conventionally referred to collectively as an "intermediate frequency strip". Such transmission amplifiers consume significant power in operation, for example intermediate frequency amplifier circuits employed in mobile telephones typically consume between several hundred microamperes and several mA of current when operational.

In order to provide modern mobile telephones with extended operating time from their associated batteries, new types of battery have been researched and developed which provide enhanced charge storage to weight performance, for example rechargeable metal hydride and lithium batteries.

The inventor has appreciated, rather than concentrating on improving battery technology, that reduction in current consumption of intermediate frequency amplifier circuits in radio receivers is desirable to provide extended operating time from batteries. The invention has therefore been made in a endeavour to provide an alternative type of amplifier circuit, for example a circuit especially suitable for use at intermediate frequencies in radio receivers which is capable of requiring less power to operate.

It is known in the art, as described in a Japanese patent application JP 600127806A, to provide a microwave multistage amplifier comprising a cascaded series of inter-stage isolators connected to associated reflection amplifiers and delay circuits. The circulators are operable to hinder spontaneous oscillation from arising within the microwave amplifier.

According to the present invention, there is provided an amplifier circuit for receiving an input signal and providing a corresponding amplified output signal, the circuit characterised in that it comprises:

(a) a plurality of reflection amplifiers cascaded in series along a signal path and operative to amplify the input signal propagating in a forward direction therealong to provide the output signal; and (b) connecting means for connecting the reflection amplifiers to form the signal path and for hindering signal propagation in a reverse direction therealong, thereby counteracting spontaneous oscillation from arising within the circuit, the connecting means incorporating switching means for alternatively switching a plurality of the reflection amplifiers such that each reflection amplifier is operable to receive signals propagating in the forward direction along the path and to output the signals after amplification to the signal path to propagate further in the forward direction therealong, the reflection amplifiers incorporating signal delaying means for delaying signal propagation to and from the reflection amplifiers.

The invention provides the advantage that incorporation of the delaying means enables the switching means to partition the input signal into discrete segments which are stored for a period of time within the delaying means, thereby providing the switching means with time to direct the segments in the forward direction along the signal path and prevent them from flowing in the reverse direction along the path which would give rise to spontaneous oscillation.

One skilled in the art would not expect it to be practicable to connect a plurality of reflection amplifiers together and obtain stable amplification therefrom because of spontaneous interfering oscillations which would arise during operation. The circuit addresses this problem by incorporating the connecting means which promotes intended signal amplification in the circuit and counteracts signal amplification giving rise to spontaneous oscillation therein.

Spontaneous oscillation is defined as self induced oscillation arising along a signal path providing amplification as a consequence of feedback occurring around or within the signal path.

Thus, conveniently, the delaying means comprises a plurality of delay lines, such that a delay line is interposed between each reflection amplifier and the switching means. This provides the advantage that each reflection amplifier can be isolated by the switching means for purposes of switching discrete signal segments.

Preferably, the delay lines are operative to provide bandpass signal transmission therethrough. This provides the advantage that the amplifier circuit is capable of providing a bandpass transmission characteristic appropriate for intermediate frequency amplifiers for use in, for example, radio receivers and mobile telephones.

In another aspect, the invention provides a method of amplifying an input signal and providing a corresponding amplified output signal, the method including the steps of:

(a) providing a plurality of reflection amplifiers cascaded in series along a signal path, and connecting means for connecting the reflection amplifiers to the signal path, the connecting means operative to promote signal propagation in a forward direction along the path and counteract signal propagation in a reverse direction therealong, the connecting means incorporating switching means for alternatively switching a plurality of the reflection amplifiers such that each amplifier is operable to receive signals propagating in the forward direction along the signal path and to output the signals after amplification to the signal path to propagate further in the forward direction therealong, the reflection amplifiers incorporating signal delaying means for delaying signal propagation to and from the reflection amplifiers;

(b) receiving the input signal at the signal path;

(c) directing the input signal through the connecting means to one of the reflection amplifiers for amplification therein to provide an amplified signal;

(d) directing the amplified signal in the forward direction to another of the reflection amplifiers for further amplification therein;

(e) repeating step (d) until the amplified signal reaches an output of the signal path; and (f) outputting the amplified signal as the output signal from the signal path.

The method provides the advantage that, during amplification, the signal is selectively directed from amplifier to amplifier in a forward direction along the signal path, thereby counteracting any of the amplifiers reamplifying the input signal and hence preventing any feedback loops being established in which spontaneous oscillation can arise.

Figure 2:
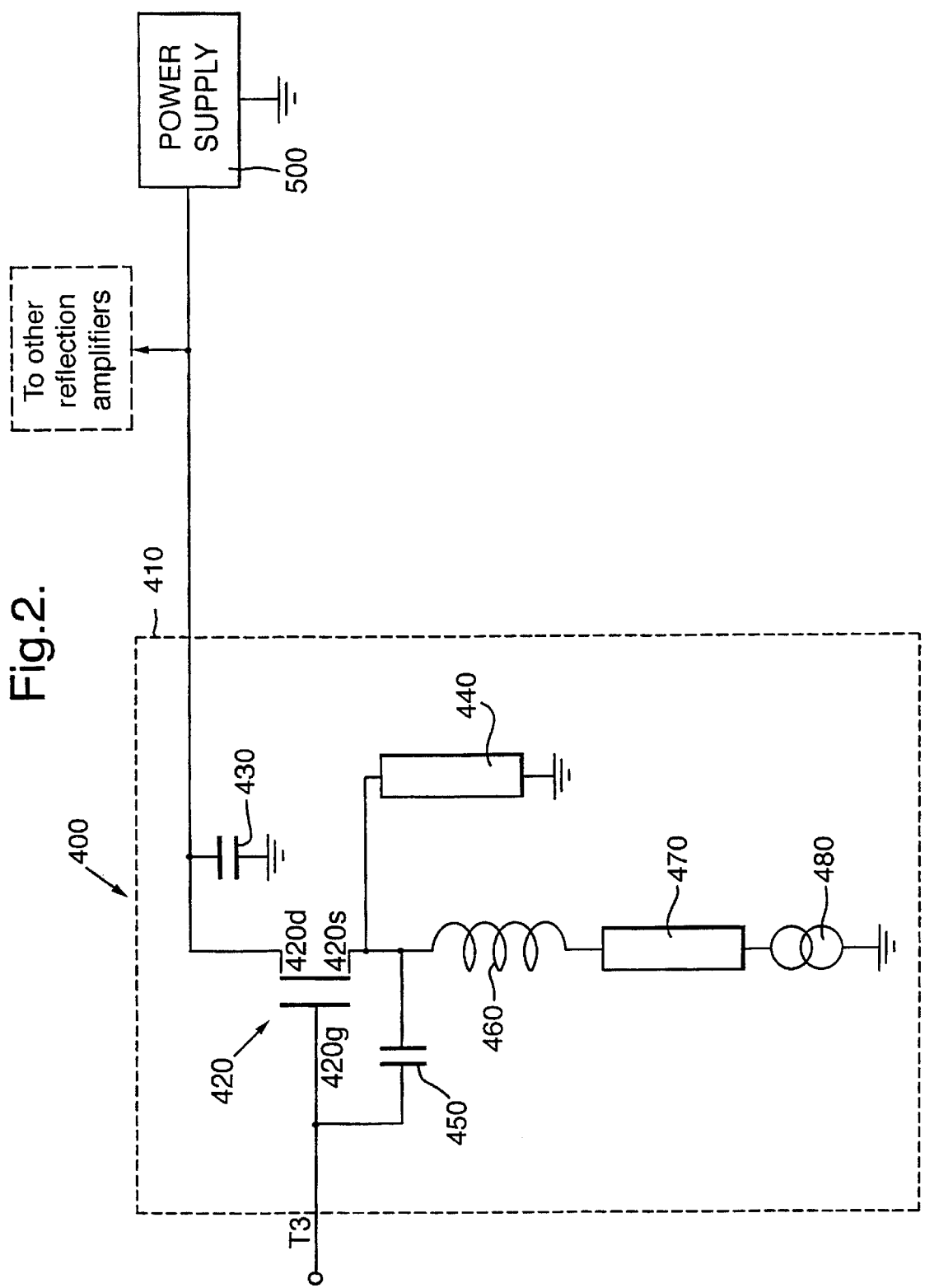

Embodiments of the invention will now be described, by way of example only, with reference to the following diagrams in which:

FIG. 1 is a schematic of an amplifier circuit in accordance with an embodiment of the invention; and FIG. 2 is a schematic of a circuit of a reflection amplifier for incorporating into the circuit in FIG. 1.

Referring to FIG. 1, there is shown an amplifier circuit, indicated by 100, according to an embodiment of the invention. The circuit 100 comprises four reflection amplifiers 110, 120, 130, 140, four bandpass filter delay elements 150, 160, 170, 180, four switches 200, 210, 220, 230 and two logic inverters 250, 260. The amplifiers 110, 120, 130, 140 in combination with their associated delay elements 150, 160, 170, 180 and their switches 200, 210, 220, 230 are connected to form STAGE 1, STAGE 2, STAGE 3, STAGE 4 respectively. The STAGES 1–4 are shown within dotted lines 300–330 respectively. The STAGE 2 and STAGE 4 also incorporate the inverters 250, 260 respectively.

Each filter element 150, 160, 170, 180 incorporates a first signal port T1 and a second signal port T2. In operation, the filter elements 150, 160, 170, 180 each provide bandpass signal filtration as well as providing signal storage, for a period τ, thereby providing signal propagation delay therethrough. The filter elements are mutually identical, namely providing an identical bandpass transmission characteristic with mutually similar centre frequencies, and can each be implemented as individual devices or fabricated integrally onto a single substrate.

The reflection amplifiers 110, 120, 130, 140 are mutually identical and employ a circuit configuration as shown in FIG. 2. Such reflection amplifiers are also described in our UK Patent number GB 2 284 323B which is herein incorporated by reference.

Each amplifier 110, 120, 130, 140 incorporates an input/output port T3 whereat signals are received and then reflected with increased magnitude on account of a negative resistance being presented at the port T3 during operation.

The switches 200, 210, 220, 230 are also mutually identical. Each switch incorporates a wiper terminal A, two switch pole terminals B and C, and a switch control terminal D for receiving a binary switching signal which alternates in operation between a logic state 0 and a logic state 1. When the binary signal is in the logic state 0, the terminal A is connected to the terminal B. Conversely, the terminal A is connected to the terminal C when the binary signal is in the logic state 1.

The terminals D of the switches 210, 230 are connected through the inverters 250, 260 respectively to an applied control line represented by $S_c$. Moreover, the terminals D of switches 200, 220 are connected directly to the control line $S_c$. Thus, in operation, the switches 200, 220 are oppositely connected relative to the switches 210, 230 by virtue of relative wiper positions.

In each of the STAGES 1–4, the terminal A is connected to the port T1, and the port T2 is connected to the port T3. Moreover, the terminal B of the STAGE 1 is connected to receive an input signal $S_{in}$, and the terminal C of STAGE 4 is connected to output an output signal $S_{out}$. Furthermore, the terminals C of the STAGES 1–3 are connected to the terminals B of the STAGES 2–4 respectively.

Operation of the circuit 100 will now be described with reference to FIG. 1. Initially, at a time t=0, the control signal $S_c$ is in the logic state 0 so that the terminals A of switches 200, 220 are connected to the terminals B thereof, and the terminals A of switches 210, 230 are connected to the terminals C thereof. The signal $S_{in}$ passes to the terminal B of the switch 200 and continues therethrough from the terminal A to the port T1 of the filter element 150. The signal $S_{in}$ propagates through the filter element 150 wherein it is filtered and emerges therefrom at a time t=τ as a first delayed signal. The first signal is amplified by the reflection amplifier 110 and then is reflected back into the filter element 150 through which it propagates to emerge at a time t=2τ as a second delayed signal.

At a time t=2τ, the signal $S_c$ switches to the logic state 1 which connects the terminals A of the switches 200, 220 to the terminals C thereof, and connects the terminals A of the switches 210, 230 to the terminals B thereof. The second signal passes from the terminal C of the STAGE 1 to the terminal B of the STAGE 2, from which it propagates to the filter element 160 to emerge therefrom at its port T2 as a third delay signal at a time t=3τ. The third signal is reflectively amplified by the reflection amplifier 120 and then passes back to the filter element 160 to propagate therethrough to emerge as a fourth delayed signal at a time t=4τ from the port T1.

At a time t=4τ, the signal $S_c$ switches back to the logic state 0 which reconnects the terminals A of the switches 200, 220 to the terminals C thereof, and connects the terminals A of the switches 210, 230 to the terminals B thereof. This mutually isolates STAGES 1 and 2, and likewise STAGES 3 and 4, thereby preventing signals passing back towards the terminal B of the STAGE 1, thereby counteracting spontaneous oscillation arising due to reflection of radiation between a stage and its preceding stage. The fourth signal continues to propagate through the STAGES 3 and 4, in a similar manner to the STAGES 1 and 2, and is eventually output at the terminal C of the STAGE 4 at a time t=8τ, namely as the output signal $S_{out}$.

Incorporating the switches 200, 210, 220, 230 to periodically isolate the amplifiers 110, 120, 130, 140 as described above provides the advantage of interrupting the formation of standing waves within the circuit 100, thereby counteracting spontaneous oscillation therein. This allows higher signal amplification approaching +30 dB for each stage, for example, to be achieved. If the switches were omitted and the terminals T1 of the filter elements connected together to form a common input/output node, severe oscillation problems would arise in the circuit 100 due to uninterrupted signal reflection from stage to stage.

The circuit 100 thus provides pseudo—continuous amplification which is interrupted periodically at intervals of 4τ for a period 2τ. Moreover, signals require a period of 8τ to propagate through the circuit 100. When the circuit is incorporated into a radio receiver, the output signal $S_{out}$ is subsequently demodulated and high frequency artefacts arising thereby from the pseudo-continuous nature of the signal $S_{out}$ are removed by filtration.

The circuit 100 can be modified in a number of ways to provide modified circuits, namely;

(a) the filter elements 150–180 can have mutually different filtration characteristic although they all provide a mutually similar propagation delay τ and in combination when operative to transmit signals therethrough;

(b) although four stages, namely the STAGES 1–4, are included in the circuit, two or more stages can be used;

(c) the reflection amplifiers 110–140 can be mutually different and provide mutually different signal amplification, for example the STAGE 1 can provide more gain relative to the STAGE 4; and (d) the reflection amplifiers 110, 120, 130, 140 can be arranged so that their bias currents are controlled, for example by an automatic gain control (AGC) signal so that amplification provided by the amplifier circuit 100 is dynamically alterable in response to the magnitude of the input signal $S_{in}$.

It is a characteristic of the reflection amplifiers 110–140 that, for a nominal amplification therein, their bandwidth reduces as their supply current is reduced. For example, when the circuit 100 provides a narrow amplification bandwidth of 50 kHz at 500 MHz and 100 dB gain, current consumption of the circuit 100 can be reduced to a few tens of microamperes for a 3 volt power supply potential applied thereto; this is considerably less current than prior art transmission amplifier circuits which would, for example, consume several mA of current to provide a corresponding amplification function.

The reflection amplifiers 110–140 will now be further described with reference to FIG. 2. A circuit for each of the amplifiers 110–140 is indicated by 400. The circuit 400 is included within a dotted line 410 and comprises a silicon or gallium arsenide (GaAs) transistor indicated by 420, a capacitor 430 and a resistor 440 forming a termination network for the transistor 420, a feedback capacitor 450, an inductor 460 and a resistor 470 forming a bias network, and a current source 480. The circuit 400 includes an input/output port T3 which is connected to a gate electrode 420g of the transistor 420 and to a first terminal of the capacitor 450.

The circuit 400 is connected to a power supply 500 for supplying the circuit 400 with power; the supply 500 is also connected to other of the reflection amplifiers 110–140. The supply 500 is connected to a drain electrode 420d of the transistor 420 and also to a first terminal of the capacitor 430; a second terminal of the capacitor 430 is connected to a signal ground. The capacitor 450 provides a second terminal which is connected to a source electrode 420s of the transistor 420, to the resistor 440 which is grounded, and through the inductor 460 and the resistor 470 in series to the source 480, which is connected to the signal ground.

In operation of the circuit 400, the gate electrode 420g receives an incoming signal applied through the port T3. The incoming signal causes a signal current corresponding to the incoming signal to flow between the source electrode 420g and the drain electrode 420d. The signal current is coupled through gate-drain and gate-source capacitances of the transistor 420 and also through the capacitor 450, thereby generating an outgoing signal at the gate electrode 420g which is an amplified version of the incoming signal. The incoming signal is reflected at the gate electrode 420g where it is combined with the outgoing signal which propagates out through the port T3.

On account of the circuit 400 receiving the incoming signal and returning the combined signal via one terminal, namely the port T3, it behaves as a reflecting negative resistance.

The circuit 400 and its associated components shown within the dotted line 410 are capable of providing a high power gain approaching +30 dB for a drain/source current through the transistor 420 in the order of a few tens of microamperes. Such a high power gain is not achievable from a transmission amplifier operating on such a low supply current.

When incorporated into a mobile telephone as part of its intermediate frequency strip, the amplifier circuit 100 incorporating a plurality of the circuits 400 is capable of providing an order of magnitude reduction in telephone current consumption associated with amplifying signals therein at intermediate frequencies compared to prior art. This is of considerable benefit which provides extended duration of telephone operation from power supplied from rechargeable batteries for example.

The amplifier circuit 100 incorporates a cascaded series of reflection amplifiers connected to form a signal path along which input signal amplification occurs. The reflection amplifiers are connected by switched devices, for example the switches 200, 210, 220, 230 and the filter elements 150, 160, 170, 180, to facilitate signal propagation in a forward direction along the path for amplification and counteract signal propagation in a reverse direction along the path which can give rise to spontaneous oscillation. This enables higher amplification gains to be achieved for a lower current consumption which is less than required for prior art transmission amplifiers providing comparable gain.

It will be appreciated by those skilled in the art that variations can be made to the circuit 100 without departing from the scope of the invention. Thus, alternative switching devices, or equivalent devices, can be used with reflection amplifiers provided they exhibit similar characteristics to the switches in the circuit 100, namely for counteracting spurious oscillation from arising.

The circuit 100 can be incorporated into radio receivers, for example mobile telephones, to function as intermediate frequency strips therein. Moreover, when provided with a demodulator to convert signals output from the circuit 100, the circuit is capable of operating as an IF receiver.

What is claimed is:

1. An amplifier circuit for receiving an input signal and providing a corresponding amplified output signal, the circuit comprising:

a) a plurality of reflection amplifiers cascaded in series along a signal path and operative to amplify the input signal propagating in a forward direction theralong to provide the output signal; and b) connecting means for connecting the reflection amplifiers to form the signal path and for hindering signal propagation in a reverse direction therealong, thereby counteracting spontaneous oscillation from arising within the circuit, the connecting means incorporating switching means for alternatively switching a plurality of the reflection amplifiers such that each reflection amplifier is operable to receive signals propagating in the forward direction along the path and to output the signals after amplification to the signal path to propagate further in the forward direction therealong, the reflection amplifiers incorporating signal delaying means for delaying signal propagation to and from the reflection amplifiers.

2. The circuit according to claim 1, wherein the delaying means comprises a plurality of delay lines, such that a delay line is interposed between each reflection amplifier and the switching means.

3. The circuit according to claim 2, wherein the delay lines are operative to provide a signal delay therethrough of a time period, and wherein the switching means is arranged to switch alternately at a rate having an associated time period which is a multiple of the time period.

4. The circuit according to claim 2, wherein the delay lines comprise at least one of surface acoustic wave, bulk acoustic wave, and ceramic devices.

5. The circuit according to claim 2, wherein the delay lines are operative to provide bandpass signal transmission therethrough.

6. The circuit according to claim 1, wherein the switching means comprises a series of switches cascaded in series to define the signal path, the switches being operative so that switches neighboring one another are in mutually opposite connection states to counteract, in co-operation with the delaying means, signal propagation in a reverse direction along the signal path.

7. An intermediate frequency strip incorporating an amplifier circuit for receiving an input signal and providing a corresponding amplified output signal, the circuit comprising:

a) a plurality of reflection amplifiers cascaded in series along a signal path and operative to amplify the input signal propagating in a forward direction therealong to provide the output signal; and b) connecting means for connecting the reflection amplifiers to form the signal path and for hindering signal propagation in a reverse direction therealong, thereby counteracting spontaneous oscillation from arising within the circuit, the connecting means incorporating switching means for alternatively switching a plurality of the reflection amplifiers such that each reflection amplifier is operable to receive signals propagating in the forward direction along the path and to output the signals after amplification to the signal path to propagate further in the forward direction therealong, the reflection amplifiers incorporating signal delaying means for delaying signal propagation to and from the reflection amplifiers.

8. An intermediate frequency receiver incorporating an amplifier circuit for receiving an input signal and providing a corresponding amplified output signal, the circuit comprising:

a) a plurality of reflection amplifiers cascaded in series along a signal path and operative to amplify the input signal propagating in a forward direction therealong to provide the output signal; and b) connecting means for connecting the reflection amplifiers to form the signal path and for hindering signal propagation in a reverse direction therealong, thereby counteracting spontaneous oscillation from arising within the circuit, the connecting means incorporating switching means for alternatively switching a plurality of the reflection amplifiers such that each reflection amplifier is operable to receive signals propagating in the forward direction along the path and to output the signals after amplification to the signal path to propagate further in the forward direction therealong, the reflection amplifiers incorporating signal delaying means for delaying signal propagation to and from the reflection amplifiers.

9. A mobile telephone incorporating an amplifier circuit for receiving an input signal and providing a corresponding amplified output signal, the circuit comprising:

a) a plurality of reflection amplifiers cascaded in series along a signal path and operative to amplify the input signal propagating in a forward direction therealong to provide the output signal; and b) connecting means for connecting the reflection amplifiers to form the signal path and for hindering signal propagation in a reverse direction therealong, thereby counteracting spontaneous oscillation from arising within the circuit, the connecting means incorporating switching means for alternatively switching a plurality of the reflection amplifiers such that each reflection amplifier is operable to receive signals propagating in the forward direction along the path and to output the signals after amplification to the signal path to propagate further in the forward direction therealong, the reflection amplifiers incorporating signal delaying means for delaying signal propagation to and from the reflection amplifiers.

10. A method of amplifying an input signal and providing a corresponding amplified output signal, the method comprising the steps of:

a) providing a plurality of reflection amplifiers cascaded in series along a signal path, and connecting means for connecting the reflection amplifiers to the signal path, the connecting means operative to promote signal propagation in a forward direction along the path and counteract signal propagation in a reverse direction therealong, the connecting means incorporating switching means for alternatively switching a plurality of the reflection amplifiers such that each amplifier is operable to receive signals propagating in the forward direction along the signal path and to output the signals after amplification to the signal path to propagate further in the forward direction therealong, the reflection amplifiers incorporating signal delaying means for delaying signal propagation to and from the reflection amplifiers;

b) receiving the input signal at the signal path;

c) directing the input signal through the connecting means to one of the reflection amplifiers for amplification therein to provide an amplified signal;

d) directing the amplified signal in the forward direction to another of the reflection amplifiers for further amplification therein;

e) repeating step (d) until the amplified signal reaches an output of the signal path; and f) outputting the amplified signal as the output signal from the signal path.

* * * * *